United States Patent
Phillips et al.

(10) Patent No.: US 9,345,165 B1
(45) Date of Patent: *May 17, 2016

(54) SYSTEM WITH MOVABLE COMPUTING DEVICES

(71) Applicant: Amazon Technologies, Inc., Reno, NV (US)

(72) Inventors: Charles D. Phillips, Bremerton, WA (US); Peter George Ross, Olympia, WA (US); Darin Lee Frink, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 250 days.

This patent is subject to a terminal disclaimer.

(21) Appl. No.: 14/076,918

(22) Filed: Nov. 11, 2013

Related U.S. Application Data

(63) Continuation of application No. 12/978,271, filed on Dec. 23, 2010, now Pat. No. 8,582,299.

(51) Int. Cl.
*H05K 7/14* (2006.01)
*G06F 1/16* (2006.01)
*G06F 1/18* (2006.01)

(52) U.S. Cl.
CPC ............... *H05K 7/1489* (2013.01); *G06F 1/16* (2013.01); *G06F 1/181* (2013.01)

(58) Field of Classification Search
CPC ..................................................... H05K 7/1489
USPC .................................................. 361/724–727
See application file for complete search history.

(56) References Cited

U.S. PATENT DOCUMENTS

| | | | |
|---|---|---|---|
| 2,857,558 A | 8/1955 | Fiske | |
| 3,295,905 A | 1/1967 | Sisk et al. | |
| 3,647,936 A | 3/1972 | Dryg | |
| 5,548,489 A | 8/1996 | Reed et al. | |
| 6,327,139 B1 | 12/2001 | Champion et al. | |
| 6,459,571 B1 | 10/2002 | Carteau | |
| 6,535,391 B2 | 3/2003 | Larsen et al. | |
| 6,621,692 B1 | 9/2003 | Johnson et al. | |
| 6,655,534 B2 * | 12/2003 | Williams | H05K 7/183 211/190 |
| 6,891,727 B2 | 5/2005 | Dittus et al. | |
| 7,031,588 B2 | 4/2006 | Cowley et al. | |
| 7,423,870 B2 | 9/2008 | Carlisi et al. | |
| 7,558,973 B2 | 7/2009 | Huang | |
| 7,591,056 B2 * | 9/2009 | Mimlitch, III | H05K 7/186 29/401.1 |
| 7,703,734 B2 * | 4/2010 | Chen | A47B 88/044 108/108 |
| 7,810,653 B2 | 10/2010 | Schmidtke et al. | |
| 7,821,790 B2 | 10/2010 | Sharma et al. | |
| 7,940,521 B2 | 5/2011 | Carlisi et al. | |
| 8,035,976 B2 | 10/2011 | Snider et al. | |
| 8,061,534 B2 | 11/2011 | Laursen et al. | |
| 8,582,299 B1 * | 11/2013 | Phillips | H05K 7/1489 361/724 |
| 2004/0037046 A1 | 2/2004 | Dittus et al. | |
| 2004/0120106 A1 | 6/2004 | Searby et al. | |
| 2004/0120123 A1 | 6/2004 | Mayer | |

(Continued)

*Primary Examiner* — Adrian S Wilson
(74) *Attorney, Agent, or Firm* — Robert C. Kowert; Meyertons, Hood, Kivlin, Kowert & Goetzel, P.C.

(57) ABSTRACT

A system for providing computing resources includes a mounting bar and one or more computing devices supported on the mounting bar. The computing devices are coupled to the mounting bar such that the computing devices can slide along the mounting bar from one position to another while the computing devices remains in service and installed on the mounting bar.

20 Claims, 8 Drawing Sheets

(56) References Cited

U.S. PATENT DOCUMENTS

| | | |
|---|---|---|
| 2004/0129657 A1 | 7/2004 | Dean et al. |
| 2004/0233643 A1 | 11/2004 | Bolich et al. |
| 2005/0162838 A1 | 7/2005 | Mayer |
| 2005/0237721 A1 | 10/2005 | Cowley et al. |
| 2007/0097619 A1 | 5/2007 | Quijano et al. |
| 2007/0115627 A1 | 5/2007 | Carlisi et al. |
| 2007/0217172 A1 | 9/2007 | Bisbikis et al. |
| 2008/0049385 A1 | 2/2008 | Cox et al. |
| 2008/0062655 A1 | 3/2008 | Laursen et al. |
| 2008/0144293 A1 | 6/2008 | Aksamit et al. |
| 2008/0266813 A1 | 10/2008 | Carlisi et al. |
| 2009/0034181 A1 | 2/2009 | Gizycki |
| 2010/0172083 A1 | 7/2010 | Randall et al. |
| 2010/0172087 A1 | 7/2010 | Jeffery et al. |
| 2010/0314339 A1 | 12/2010 | Laursen et al. |

\* cited by examiner

SYSTEM WITH MOVABLE COMPUTING DEVICES

This application is a continuation of U.S. application Ser. No. 12/978,271, filed Dec. 23, 2010, now U.S. Pat. No. 8,582, 299, which is incorporated by reference herein in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment. Some server systems include servers of different sizes. For example, a standard 19-inch rack may hold 10 to 20 servers having various heights of 1U, 2U, and 3U (a rack unit "U" is 1.75 inches).

In typical industry-standard racks, slots are in fixed locations. Moving a server generally requires the time-consuming and potential service interruption of powering off the server, at least partially uncabling the server, physically removing the server from the rack, then physically adding the host back to the rack in a new location.

One challenge encountered in server system utilization is increasingly fragmented available physical space over time. For example, a rack may have a filled 1U space with adjacent empty 1U spaces on either side and no other space available. To then add a new 2U server to this rack may require moving the 1U server to create a contiguous 2U empty slot.

When an individual server fails or falls below an acceptable level of performance, the server may be removed from the rack. In rack systems that include more than one server size, however, a replacement server may not fit in the slot or slots created by removal of the old server(s). For example, in a conventional rack for which a single 3U server is to replace three 1U servers scattered over the height of the rack, none of the individual slots created by removal of the three 1U servers will accommodate the new 3U server. The 3U server may be placed in an open larger slot, but this will result in wasted rack space in the form of the unfilled 1U slots. Alternatively, various servers that are not being replaced might be temporarily extracted from the rack and the servers rearranged to create a 3U slot. Such rearrangements are likely to be time-intensive and labor-intensive to carry out, however.

In some systems, a rack-level power distribution unit ("PDU") is provided in a rack to distribute electrical power to the many servers in the rack. The rack-level PDU may include a large number of receptacles, each of which may be used to supply power to a different server by way of a power cable. Over time, management of the power cables for the numerous servers during maintenance in the rack may become cumbersome and time-consuming. For example, if a server needs to be moved from one location in a rack to another, the power cable between the server and the PDU receptacle may not be long enough to allow the server to remain plugged in while the server is moved to the new location. As such, the power cable for the server may need to be unplugged to allow the move, which results in a temporary loss of computing capacity and additional maintenance procedures (such as powering up and rebooting the server after it has been reinstalled in the new location). Moreover, the power cables for the various servers may become entangled or block air flow through the rack.

Figure 1:
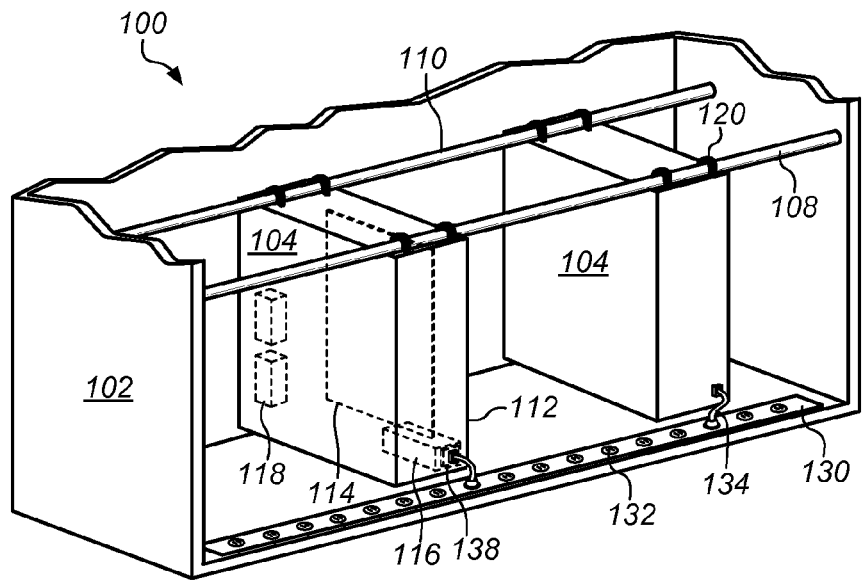
FIG. 1 illustrates one embodiment of a system that allows computer systems to be slid from one position to another in a rack.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computing devices, and systems and methods of cooling computing devices, are disclosed. According to one embodiment, a system for providing computing resources includes a mounting bar that supports one or more computing devices, such as servers. The computing devices are coupled to the mounting bar such that the computing devices can slide along the mounting bar from one position to another while the computing devices remain in service and installed on the mounting bar.

According to one embodiment, a system for providing computing resources includes one or more mounting elements (for example, shelves or hangers) that support one or more computing devices. The computing devices are coupled to the mounting elements such that the computing device can move from one position to another while the computing devices remain in service and installed on the mounting elements.

According to one embodiment, a method of managing computing resources in a rack includes moving a computing device while the computing device remains in service and installed in a rack to create or enlarge one or more open slots in the rack. At least one additional computing device is installed in the open slots.

As used herein, a "cable" includes any cable, conduit, or line that carries one or more conductors and that is flexible over at least a portion of its length. A cable may include a connector portion, such as a plug, at one or more of its ends.

As used herein, "chassis" means a structure or element that supports another element or to which other elements can be mounted. A chassis may have any shape or construction, including a frame, a sheet, a plate, a box, a channel, or a combination thereof. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computing device" includes any of various devices in which computing operation can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "coupling device" includes an element or combination of elements that can be used to couple one element or structure to one or more other elements or structures. Examples of a coupling device include a bracket, a linkage, a connecting rod, a hinge, a rail, or combination thereof.

As used herein, "data center" includes any facility or portion of a facility in which computer operations are carried out.

A data center may include servers dedicated to specific functions or serving multiple functions. Examples of computer operations include information processing, communications, testing, simulations, power distribution and control, and operational control.

As used herein, "installed" means in place on, or coupled to, a supporting structure or element. In some embodiments, a computer system is installed such that it can be moved on the structure to which it is mounted. For example, a server may be installed on a rail such that the server can slide along the rail.

As used herein, "hanger" means any element or combination of elements from which an object can be hung or suspended. A hanger may be round, square, or another shape. Examples of hangers include hooks, rods, pins, bars, beams, plates, rings, or discs.

As used herein, elements are "locked" with respect to one another if they are coupled in a way that requires an action to permit motion of one of the elements relative to other element(s). In certain embodiments, the release action for a lock may be effected by a machine (for example, a control system may automatically operate an actuator to pull a pin out of a socket). A "locking mechanism" includes any element or combination of elements that can lock two or more elements with respect to one another. Locking mechanisms may include, for example, a pin latch, a cam, or a hook.

As used herein, a "mounting bar" includes a structure, element, or combination of structures or elements on which one or more computer systems can be at least partially mounted. Examples of a mounting bar include a rail, a shelf, a rod, a beam, a block, or a tray. In some embodiments, supported elements are suspended from a mounting bar. In other embodiments, supported elements rest on a mounting bar. In some embodiments, elements can be slid from one location on the bar to another location on the bar. In certain embodiments, elements can be rolled along a bar (for example, on wheels).

As used herein, a "pin" includes any element that can be positioned to constrain or hold another element in a desired position or orientation. Suitable pins may include straight pins, pegs, threaded bolts, unthreaded bolts, bars, plates, hooks, rods, or screws.

As used herein, "power distribution unit" means any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.).

As used herein, a "rack" means a rack, container, frame, or other element or combination of elements that can contain or physically support one or more computer systems.

As used herein, "rack power distribution unit" refers to a power distribution unit that can be used to distribute electrical power to various components in a rack. A rack power distribution unit may include various components and elements, including wiring, bus bars, connectors, and circuit breakers.

As used herein, "shelf" means any element or combination of elements on which an object can be rested. A shelf may include, for example, a plate, a disc, a block, a grid, a sheet, a box, or a tray. A shelf may be round, square, or another shape. In some embodiments, a shelf may be one or more rails.

As used herein, a "slot" means an opening or space in which one or more computer systems can be installed. In some embodiments, a slot is sized to receive a server having a form factor in accordance with a standard, for example, 1U, 2U, or 3U.

As used herein, a "space" means a space, area or volume.

As used herein, "transverse", in the context of an installed component such as a server, means in a sideways direction (for example, perpendicular) to the direction of installation of the component. For example, in a rack in which servers are installed by sliding the servers forward into the rack and removed by backing the servers out of the rack, transverse directions may include left, right, up, or down, or any combination thereof.

In some embodiments, a system allows computer systems to be moved from one position to another within a rack while the computer systems remain installed in the rack. FIG. 1 illustrates one embodiment of a system that allows computer systems to be slid from one position to another in a rack. System 100 includes rack 102 and computer systems 104. Rack 102 includes rack enclosure 106, front rail 108 and rear rail 110. In one embodiment, rack 102 is a free-standing enclosure. In another embodiment, rack 102 is mounted to a wall, for example, a wall of a room in a data center.

Each of computer systems 104 includes chassis 112, circuit board assembly 114, power supply unit 116, and hard disk drives 118 (in FIG. 1, these items are shown in only one of computer systems 104 for clarity). In some embodiments, circuit board assembly 114 is a motherboard for computer system 104. In certain embodiments, a power supply unit may supply power to two or more motherboard assemblies in a computer system. In some embodiments, each of computer systems 104 is 1 rack unit (1U) wide.

Computer systems 104 include hooks 120. Computer systems 104 may be installed on front rail 108 and rear rail 110 by engaging hooks 120 on front rail 108 and rear rail 110. While installed on front rail 108 and rear rail 110, computer systems 104 can be slid left or right along front rail 108 and rear rail 110.

Rack 102 includes rack power distribution unit 130. Rack power distribution units 130 include PDU output receptacles 132. Rack power distribution units 130 may supply power to computer systems 104. For each computer system 104, one or more of power cables 134 may couple one of output receptacles 132 in rack power distribution unit 130 with input receptacle 138 on power supply unit 116 of the computer system. In an alternate embodiment, a rack power distribution unit and/or input receptacles for the computer systems in a rack are located at the rear of the rack, rather than on the front.

Power connectors for a power cable and the corresponding receptacles on a rack power distribution unit and power supply may be any of various connector types. In one embodiment, rack power distribution unit 130 has IEC C13 receptacles and power supply units 116 have IEC C14 receptacles.

Rack power distribution unit 130 may have any suitable power characteristics. Examples of output voltages for rack power distribution unit1 130 include 100 volts, 110 volts, 208 volts, and 230 volts. In certain embodiments, each of receptacles in rack power distribution unit 130 is on one phase of three-phase input power to the rack power distribution unit.

Although only two of computer systems 104 are shown in rack 102 in FIG. 1 for clarity, a rack system may in various embodiments include any number of computer systems. For example, rack 102 may hold a computer system in each 1U position in rack 102. In one embodiment, a rack system has about 20 1U computer systems.

In some embodiments, data connections between computer systems 104 and systems external to rack 102 are provided by way of a data bus. The data bus may run along the top, bottom, or one or more sides of rack 102. The data bus may run, for example, in a tray behind rack power distribution unit 130. Cables for data connections may be optical, conductive (such as copper), or a combination thereof. Data cables from the data bus (which are not shown in FIG. 1 for clarity) may couple with computer systems 104 at input/output connectors on the front of computer systems 104.

Figure 2:
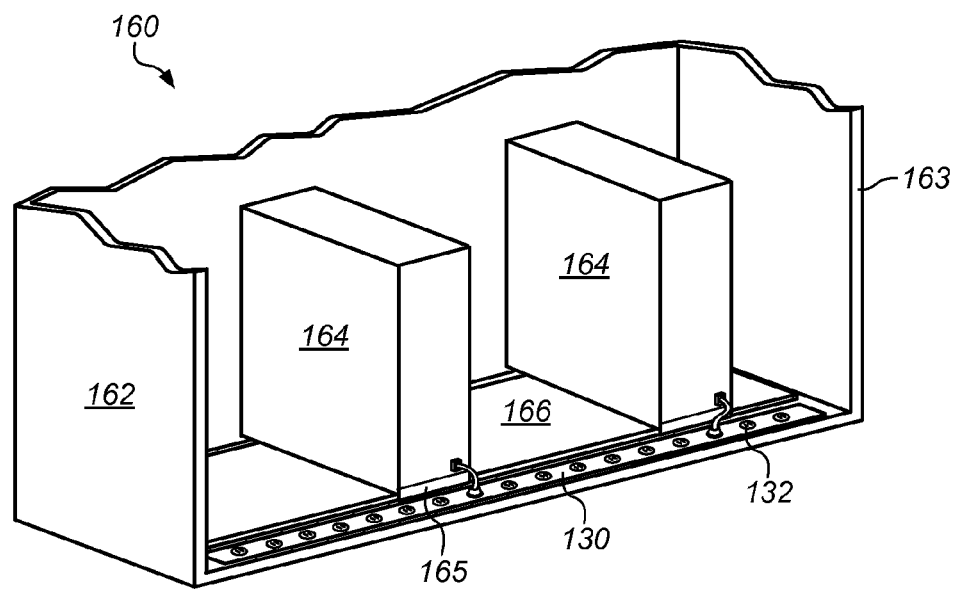
FIG. 2 illustrates an embodiment of a system with computer systems mounted on a shelf.

In some embodiments, computer systems are mounted on a shelf that allows side-to-side movement of the computer systems. FIG. 2 illustrates an embodiment of a system with computer systems mounted on a shelf. System 160 includes rack 162 and computer systems 164. Rack 162 includes rack enclosure 163 and shelf 166. Computer systems 164 include tabs 165. Tab 165 may contact the front edge of shelf 166. In some embodiments, computer systems 164 may be secured on shelf 166 by way of a fastener installed in tabs 165. In some embodiments, computer system 164 is in a standard computer system chassis and tab 165 is a rack ear on the standard chassis.

Figure 3:
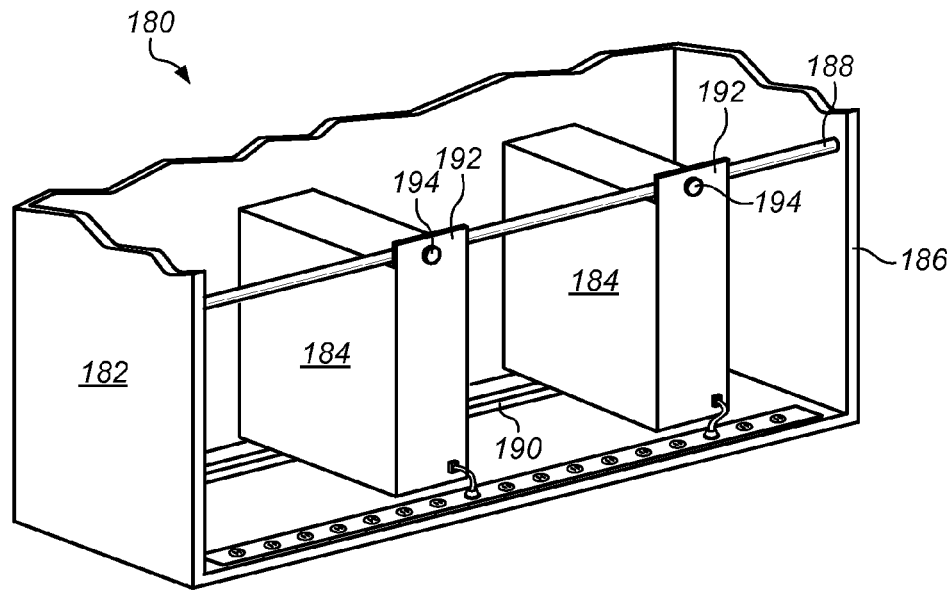
FIG. 3 illustrates an embodiment a rack system including a front hanger and a support rail.

In some embodiments, computer systems are supported by a combination of hanging and shelf supports. FIG. 3 illustrates an embodiment a front hanger and a shelf rail. System 180 includes rack 182 and computer systems 184. Rack 182 includes rack enclosure 186, hanger rail 188, and support rail 190. Computer system 184 includes tab 192. In some embodiments, computer system 184 is in a standard computer system chassis and tab 192 is a rack ear on the standard chassis. Tab 192 of computer system 184 may be engaged on hanger rail 188. Computer system 184 may rest on support rail 190. Locking pin 194 may be installed in tab 192 to secure computer system 184 on hanger rail 188.

Figure 4:
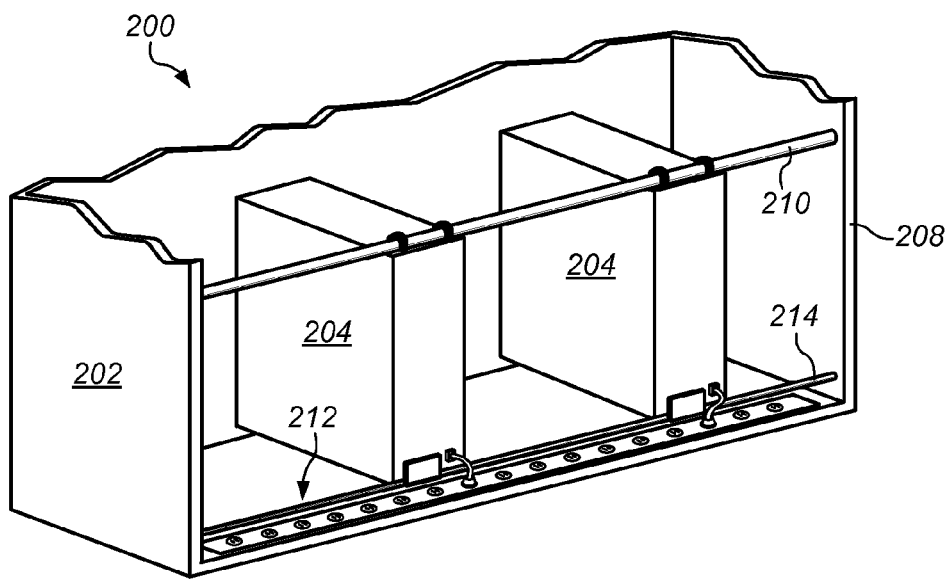
FIG. 4 illustrates an embodiment of a system in which computer systems are suspended from a horizontal rail and maintained in position in a rack with adjustable stops.

In some embodiments, the orientation of computer systems in a rack is maintained by stop elements. FIG. 4 illustrates an embodiment of a system in which computer systems are suspended from a horizontal rail and maintained in position in the rack with adjustable stops. System 200 includes rack 202 and computer systems 204. Rack 202 includes rack enclosure 208, hanger rail 210, and stop rail 212. Stop rail 212 includes rod 214 and stop plates 216. Stop plate 216 may be rotatable on rod 214. When one of computer systems 204 is installed in rack 202, the corresponding stop plate 216 may be rotated up to contact the front of the computer system. Stop plate 216 may keep the bottom of computer system 204 from swinging out on hanger rail 210 under the weight of computer system 204. In some embodiments, a lip is provided on rack 202 at the bottom of computer systems 204 that stops outward rotation of computer system 204.

Although in FIGS. 1-4, computer systems are arranged in a row at a single level, a system may in various embodiments include two or more rows of computer systems (for example, two or more rails shelves or two or more rails, each at a different height).

Figure 5A:
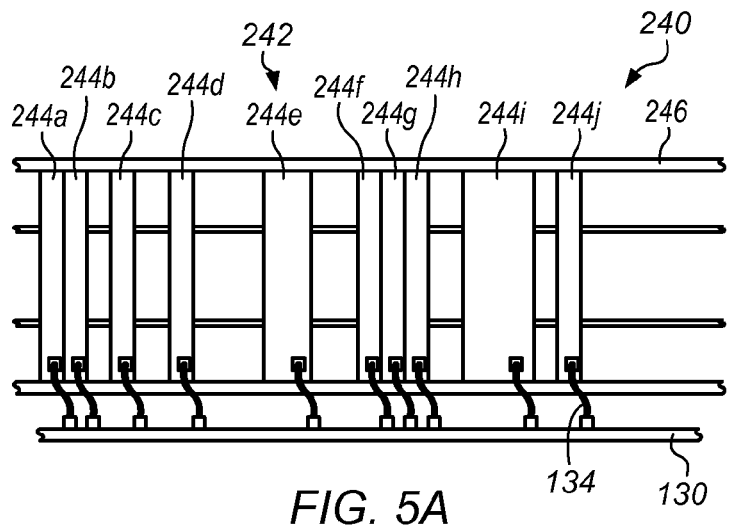
FIGS. 5A-5C are schematic diagrams illustrating a sequence of rearranging of computer systems in a rack to increase contiguous space in the rack.
Figure 5B:
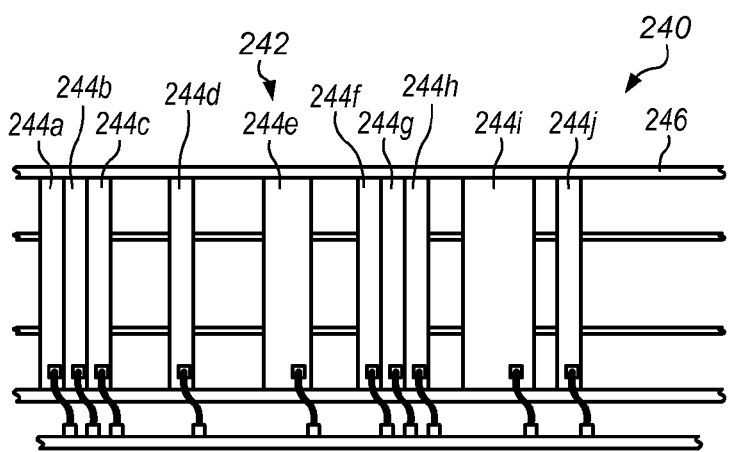
Figure 5C:
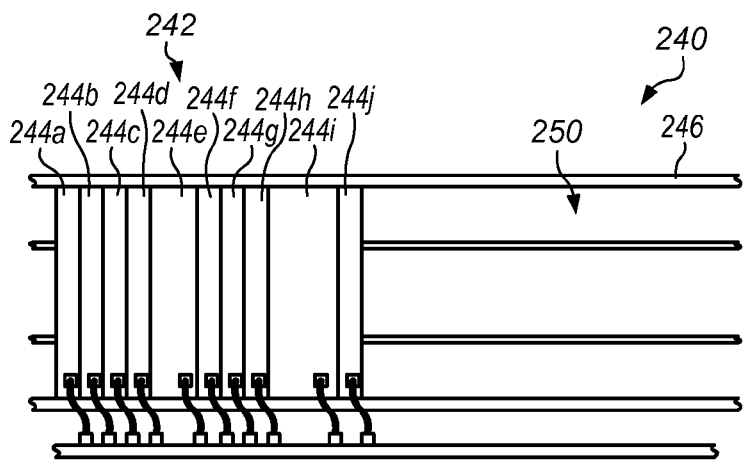

In some embodiments, computer systems in a rack are repositioned by sliding the computer systems while installed in the rack to increase the number of contiguous slots available for computer systems in the rack. FIGS. 5A-5C are schematic diagrams illustrating a sequence of rearranging of computer systems in a rack to increase contiguous space in the rack. In the embodiment shown in FIG. 5A, system 240 includes rack 242 and computer systems 244. In some embodiments, computer systems 244 are servers. Rack 244 includes hanger rail 246. Computer systems 244 may be slid left and right on hanger rail 246 to allow repositioning of various computer systems 244 in rack 242.

In FIG. 5B, computer system 244c has been moved to next to computer system 244b, thereby eliminating an empty slot between computer system 244b and 244c. In FIG. 5C, computer systems 244d-244j have been moved to eliminate empty slots between the computer systems. Moving computer systems to the locations shown in FIG. 5C may free up contiguous slots for installing additional servers, as reflected in space 250 shown in FIG. 5C.

Although in the embodiment shown in FIGS. 5A-5C, computer systems 244 are mounted on hanger rail 246, the computer systems shown and described as being installed on a hanger rail, computer systems 244 may be mounted in any manner, including any of the various mounting arrangements described above relative to FIGS. 1-4.

In some embodiments, a system includes a cable management system that allows movement of servers in the rack without interrupting power to the servers that are being moved in the rack. In certain embodiments, a system includes redundant power cables for one or more servers in the system. Redundant power cables on a server may allow the server to be moved from one location in a rack to another location while the server remains powered-up. FIG. 6A-6D are schematic diagrams illustrating moving servers from one location to another in a rack using redundant power cables to maintain continuous power to the servers.

In FIGS. 6A-6D, rack system 280 includes servers 282a, 282b, and 282c, hanger rail 284, and rack PDU 286. Servers 282a, 282b, and 282c are installed on hanger rail 284. Each of servers 282a, 282b, and 282c includes redundant left and right power cables 288 (in FIGS. 6A-6D, each pair of power cables 288 is marked as "L" and "R" for illustrative purposes). The left and right power cables for each server may be wired in parallel to an input to the power supply unit for the server. Rack PDU 286 includes numerous power receptacles. Rack PDU 286 may supply power to servers 282a, 282b, and 282c by way of power cables 288.

Figure 6A:
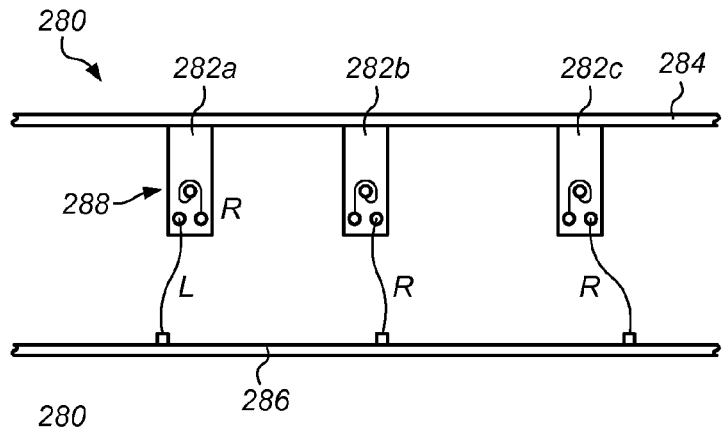
FIG. 6A-6D are schematic diagrams illustrating moving servers from one location to another in a rack using redundant power cables to maintain continuous power to the servers.

In FIG. 6A, server 282a is powered by way of left power cable L, and right power cable R is in a stowed position on server 282a. Servers 282b and 282c are powered by way of right power cables R, and left power cables L are in a stowed position on servers 282b and 282c.

Figure 6B:
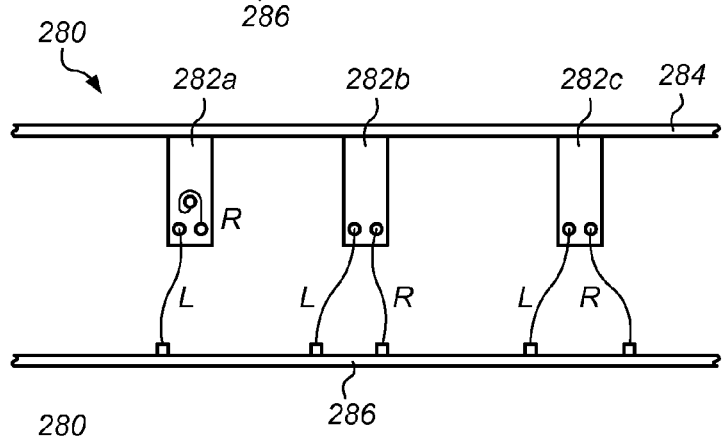

FIG. 6B illustrates rack 280 after operations have commenced to reduce spatial fragmentation of the servers in rack 280. In this example, reducing spatial fragmentation includes shifting servers 282b and 282c so that servers 282a, 282b, and 282c are contiguously grouped near the left side of rack 280. During movement of servers 282b and 282c, all of servers 282a, 282b, and 282c may remain in a powered-up state.

For purposes of this illustration, it is assumed that right power cables R for servers 282b and 282c may not have enough slack to allow servers 282b and 282c to be shifted to the contiguous positions next to server 282a while the right power cables R remain plugged in. To allow servers 282b and 282c to remain powered up during the move, left power cables L may be deployed. For each of servers 282b and 282c, left power cable L may be released from its stowed position on the server and plugged into rack PDU 286 to the left of the server. While left power cables L are being plugged into rack PDU 286, right power cables R may remain plugged into rack PDU 286, such that power is continuously maintained to servers 282b and 282c.

Figure 6C:
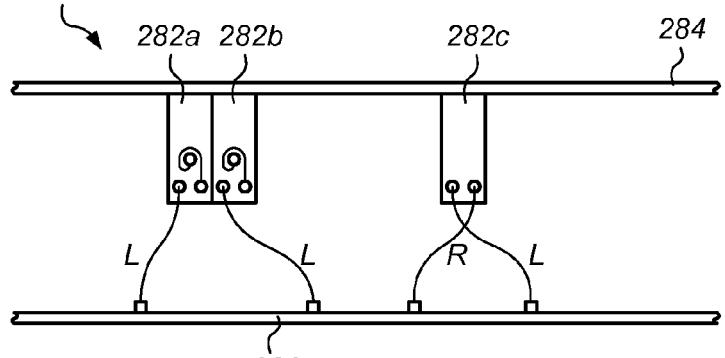

As reflected in FIG. 6C, once power is being supplied to server 282b through left power cable L, right power cables R may be removed from rack PDU 286 and placed in a stowed position on server 282b. Server 282b may be slid leftward until it is contiguous with server 282a.

Figure 6D:
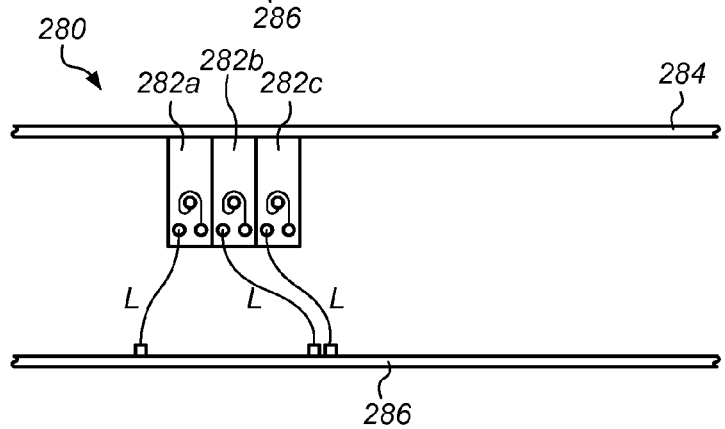

In a similar manner, once power is being supplied to server 282c through left power cable L, right power cable R may be removed from rack PDU 286. Server 282c may be slid leftward on hanger rail 282 to the left, toward servers 282a and 282b. Because server 282c is much further to the right in rack 280, however, server 282c cannot be slid far enough to the left to be contiguous with server 282b (see FIG. 6C, for example). At this time, right power cable R may be reinstalled in rack to the left of server 282c. Left power cable L (which is now limiting leftward movement of server 282c) may now be removed from rack PDU 286, thereby allowing server 282c to be moved further to the left. The alternating left-right sequence between the left power cable L and right power cable R shown for server 282c in FIGS. 6A-6D may be repeated as many times as necessary, with power continuously maintained to server 282c, to allow server 282c to reach a position next server 282b, such that servers 282a, 282b, and 282c are contiguously grouped together, as shown in FIG. 6D.

In certain embodiments, a separate power cable may be used to provide a redundant power connection to a server. For example, rather than having permanent left and right redundant power cables for a server, a server may include one or more power receptacles into which a temporary, stand-alone power cable can be installed to create a redundant power connection for the server.

In some embodiments, a system with movable computer systems includes a power rail. The power rail may be a "hot" rail that can provide power to computer systems at various locations along the width or height of the system. In one embodiment, a power rail is at about 12 volts DC. A power rail may, however, be maintained at any voltage. A power rail coupling device may be provided as part of, or coupled to, each computer system. The power rail coupling devices may remain engaged on the power rail as the computer systems are moved. For example, a power coupling device may include a spring contact that is electrically coupled with a power supply in a computer system. The spring contact may remain engaged with the power rail as the computer system slides along the rail. In certain embodiments, a system includes two or more power rails (for example, one at 12 volts DC and another at 0 volts).

In some embodiments, a structural element for supporting computer systems (such as a mounting bar) also serves as a power rail for the computer systems. For example, in one embodiment, hanger rail 246 shown in FIG. 5A may be a hot rail that supplies power to computer systems 244. In other embodiments, a power rail is separate from the structural elements in a system (for example, a dedicated power rail).

Figure 7A:
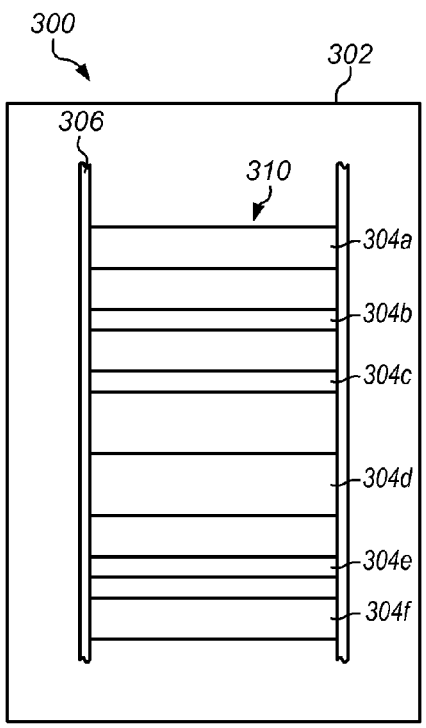
FIG. 7A illustrates a system that includes servers mounted in a horizontal orientation on a pair of side rails in a rack.
Figure 7B:
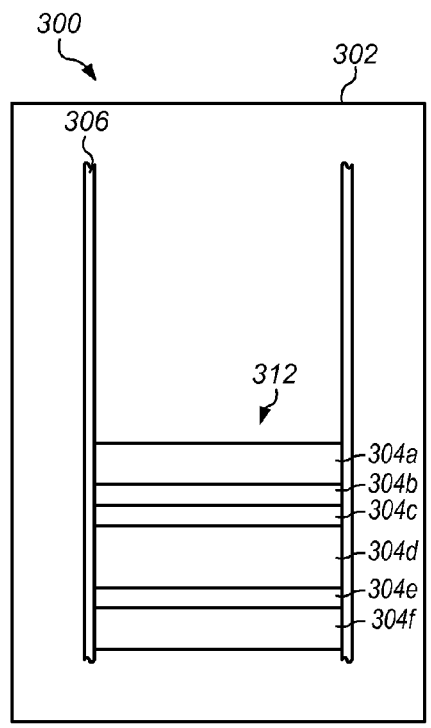
FIG. 7B illustrates computer systems in a rack after the servers in the rack have been moved to increase the number of contiguous slots in the rack.

In various embodiments, computer systems mounted in a horizontal orientation may be moved up and down within a rack. FIG. 7A illustrates a system that includes servers mounted in a horizontal orientation on a pair of side rails in a rack. FIG. 7B illustrates computer systems in a rack after the servers in the rack have been moved to increase the number of contiguous slots in the rack. System 300 includes rack 302 and computer systems 304a-304f. Computer systems 304a-304f may be mounted on rails 306. In one embodiment, rack 302 is a standard 19-inch rack. In the arrangement shown in FIG. 7A, numerous empty slots 310 exist between various of computer systems 304a-304f.

As reflected in FIG. 7B, computer systems 304a-304f may be slid along rails 308 so that some or all of computer systems 304a-304f are grouped in a contiguous spatial arrangement with one another. Physically grouping computer systems together may create or increase the size of open slots in a rack. For example, grouping computer systems 304a-304f creates opening 312.

Figure 8:
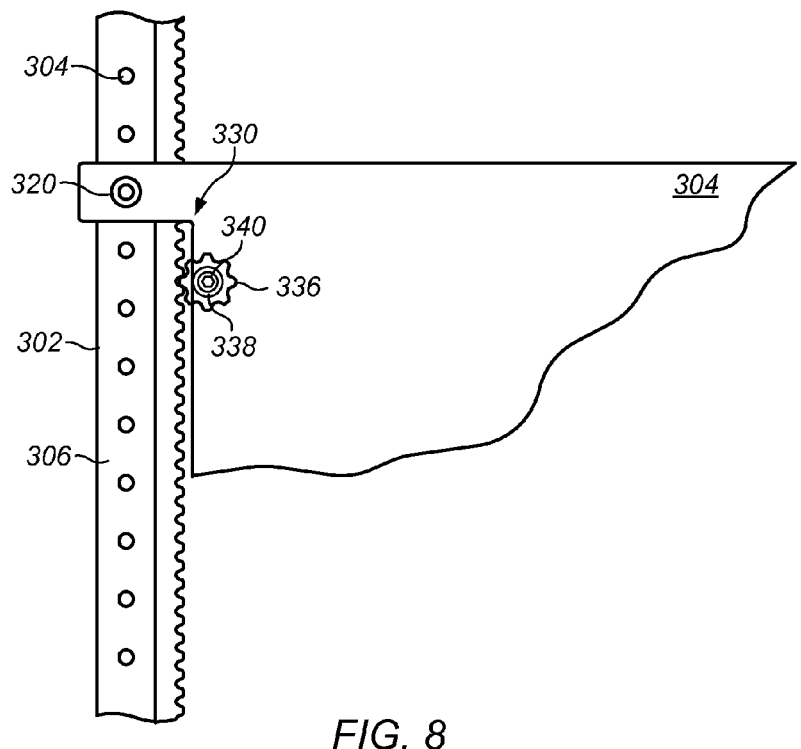
FIG. 8 illustrates a system including a system having a locking mechanism.

In some embodiments, a rack system includes a locking mechanism. FIG. 8 illustrates a portion of system including a system having a locking mechanism. System 300 includes rack 302 and computer system 304. The arrangement of computer systems 304 in rack 302 may be similar to that shown in FIGS. 7A and 7B. Computer system 304 includes latching pin 320. Latching pin 320 may engage in one of holes 322 in rail 306 of rack 302. In some embodiments, latching pin 320 is spring-loaded.

Holes 322 may be used to space computer systems at predefined spacing increments. In some embodiments, holes 322 are spaced to create standard-size slots for computer systems (1U, 2U, etc.) In certain embodiments, a system may include a detent mechanism that holds a computer system at a predetermined spacing. For example, a computer system may include a ball-detent mechanism that engages holes along a rack rail, such as holes 322. In certain embodiments, a rack allow for spacing at fractional spacing relative to a standard (for example, spacing at one-quarter U increments). In certain embodiments, a rack may allow continuous variable spacing.

In some embodiments, a rack system includes one or more mechanisms for assisting movement of computer systems within the rack. For example, system 300 shown in FIG. 8 includes lift mechanism 330. Lift mechanism 330 includes rack 332 on rail 334 and pinion 336 in computer system 304.

Pinion 336 may be mounted for rotation in computer system 304 on carrier bushing 338. Carrier bushing 338 may be attached, for example, to an enclosure for computer system 304. Pinion 336 may engage on rack 332 in on rail 334. Pinion 336 may be rotated to move computer system 304 up or down on rail 334.

In some embodiments, a lift mechanism is operated using a power tool. For example, pinion 336 includes socket 340. In one embodiment, a power drill with a hex driver attachment is inserted in socket 340. The power drill may be operated to turn pinion 336 on rail 334 to assist in the raising or lowering of computer system 304 in rack 302. In certain embodiments, a mechanism provides a pneumatic or hydraulic assist for one or more computer systems in a rack.

In certain embodiments, a holding device is provided on a lift mechanism. The holding device may maintain a computer system at a desired level in a rack. For example, rotational coupling of pinion 336 may have sufficient friction to hold computer system 304 at a given level in rack 302. In another embodiment, the rotational coupling for pinion 336 includes a ratchet mechanism. The ratchet mechanism may keep the computer system from dropping in the rack unless the ratchet mechanism is released.

In the embodiment shown in FIG. 8, only one lift mechanism is depicted for illustrative purposes. In various embodiments, however, a computer system may have two or more lift mechanisms. In one embodiment, a computer system includes a lift mechanism on each side of the computer system (for example, the left side and the right side). In various embodiments, a lift mechanism is part of a rack. In various embodiments, a lift mechanism is provided in a hanger or carrier for a computer system.

Figure 9:
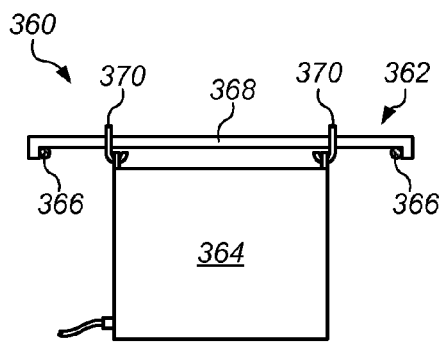
FIG. 9 is a side view of a system that includes one embodiment of an adjustable mount for supporting computer systems of differing depths.

In some embodiments, a system includes slidable mounts that are adjustable to accommodate computer systems of different sizes. FIG. 9 is a side view of a system that includes one embodiment of an adjustable mount for supporting computer systems of differing depths. System 360 includes mounting system 362 and computer system 364. Mounting system 362 includes rails 366, rod 368, and hooks 370. Rods 368 span rails 366. Hooks 370 may be adjustable on rod 368 to various locations between rails 366. Hooks 370 may be spaced apart an appropriate distance for coupling with computer system 364. Rod 368 may slide along rails 366 to allow side-to-side positioning of computer system 364.

In some embodiments, a system includes carriers that allow servers to be moved from one location to another on a shelf or rail while the servers remain installed.

Figure 10A:
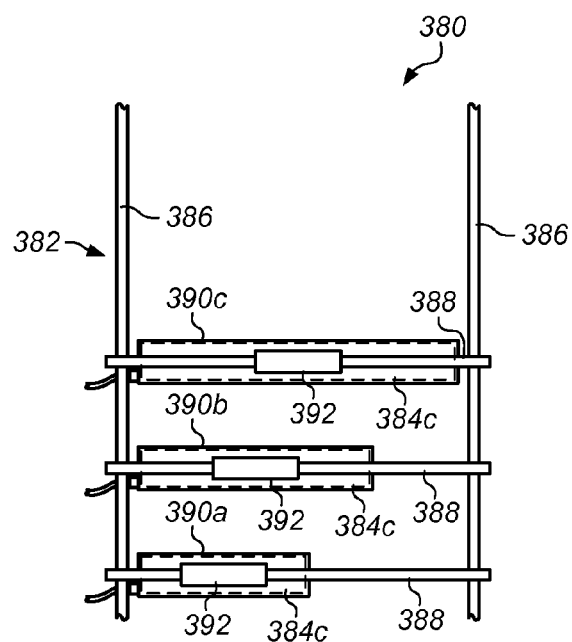
FIG. 10A is a top view illustrating an embodiment of a system that includes slidable carriers for servers in a rack.
Figure 10B:
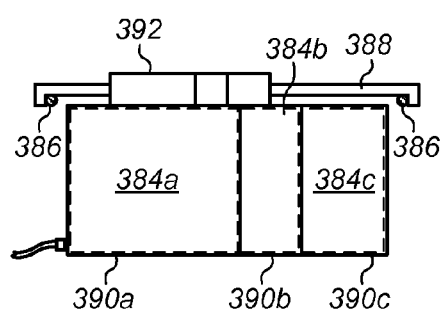
FIG. 10B is a side view illustrating an embodiment of a system that includes slidable carriers for servers in a rack.

In some embodiments, the carriers allow sliding from one location to one another. Examples of carriers include a sleeve, a bar, a case, a plate, a hook, a frame, or combinations thereof. FIG. 10A is a top view illustrating an embodiment of a system that includes slidable carriers for servers in a rack. FIG. 10B is a side view illustrating an embodiment of a system that includes slidable carriers for servers in a rack. System 380 includes mounting system 382 and computer systems 384a, 384b, and 384c. Mounting system 382 includes rails 386, rod 388, and carriers 390a, 390b, and 390c. Carriers 390a, 390b, and 390c include hanger sleeves 392. Rods 388 span rails 386. Hanger sleeves 392 may be adjustable on rods 388 to various locations between rails 386.

Computer systems 384a, 384b, and 384c may be installed in carriers 390a, 390b, and 390c. Each of carriers 390a, 390b, and 390c may be size to accommodate a different size computer system. For example, in the embodiment shown in FIGS. 10A and 10B, carriers 390b and 390c are longer than carrier 390a. Rods 388 may slide along rails 386 to allow side-to-side positioning of computer systems 384a, 384b, and 384c.

Figure 11:
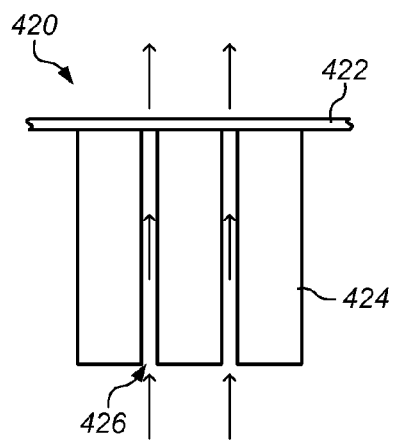
FIG. 11 illustrates a system in which computer systems have been spaced from one another to allow air flow between the computer systems.

In some embodiments, computer systems are positioned to be spaced from one another to facilitate air flow for cooling the computer systems. FIG. 11 illustrates a system in which computer systems have been spaced from one another to allow air flow between the computer systems. System 420 includes rack rail 422 and computer systems 424. Computer systems 424 may be slid on mounting system so that gaps 426 are present between the computer systems. In one embodiment, computer systems 424 are 1U wide and spaces 426 are about 0.25 U wide.

Figure 12B:
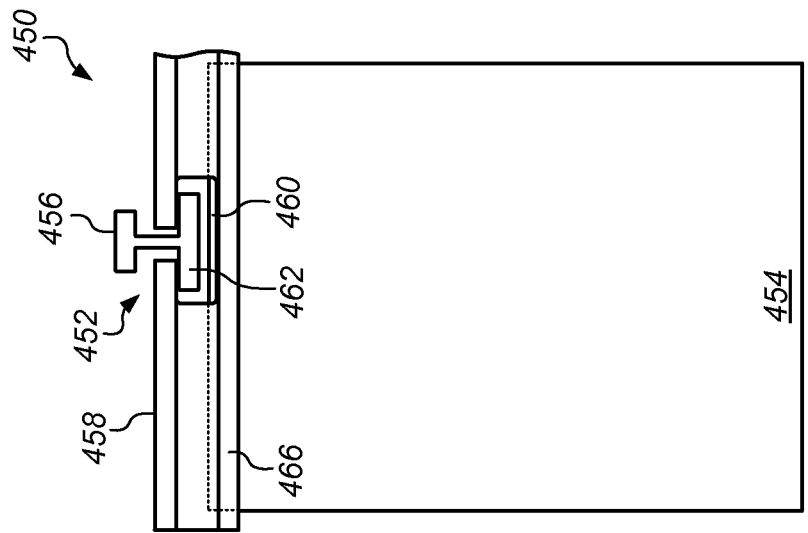
FIG. 12B is a side view illustrating an embodiment of an interconnecting rail system.
Figure 12A:
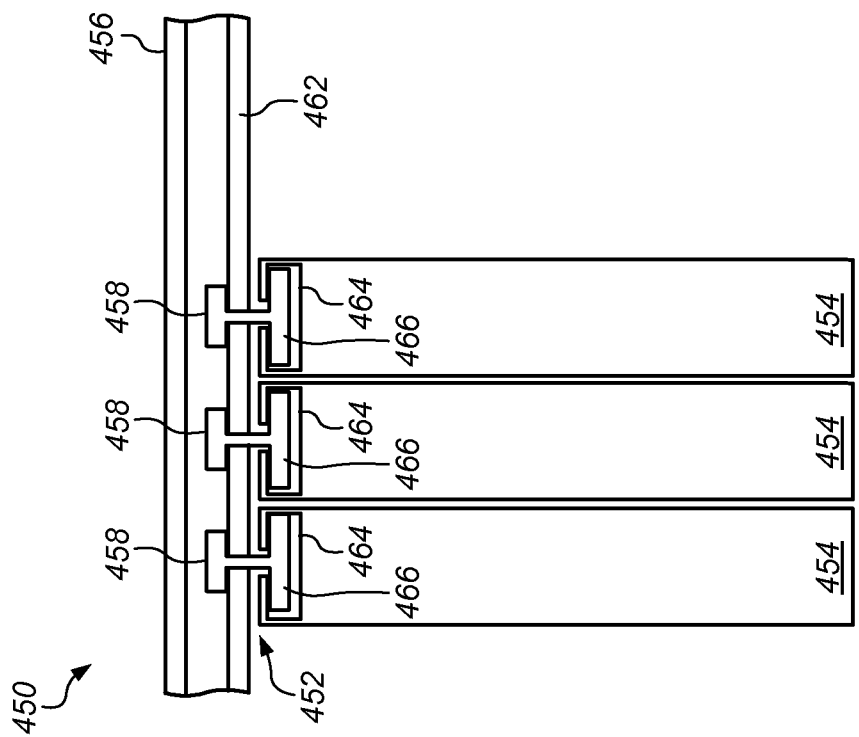
FIG. 12A is a front view illustrating an embodiment of an interconnecting rail system.

In some embodiments, a mounting system includes interconnecting rails that allow computing devices to be translated either front to back or side-to-side. FIG. 12A is a front view illustrating an embodiment of an interconnecting rail system for servers. FIG. 12B is a side view illustrating an embodiment of an interconnecting rail system for servers. System 450 includes interconnecting rail system 452 and servers 454. Interconnecting rail system 452 includes cross rail 456 and hanger rails 458. Each of hanger rails 458 includes slot 460. Each of servers 454 include slot 464. Hanger rails 458 may engage on lower flange 462 of cross rail 456 at slots 460. Servers 454 may engage on lower flanges 466 of hanger rails 458. Servers 454 can be slid forward and back on hanger rails 458. Any of servers 454 can be laterally positioned by sliding the respective hanger rail 458 (for example, from left to right) on cross rail 456.

As shown in FIGS. 12A and 12B, the cross sections of hanger rails 458 and cross rail 456 may, in one embodiment, be an I-beam shape. The cross sections of hanger rails 458 and cross rail 456 may, however, be any suitable shape, such as rectangular, round, T-shaped, or L-shaped. In some embodiments, hanger rails may engage on twor or more cross rails (for example, one cross rail near the front of a rack and another cross rail near the back of the rack).

In some embodiments, a faceplate of each server can double as a spacer to keep components in adjacent servers from colliding with each other (for example, during shock or vibration loads encountered during transportation, or during an earthquake.) In some embodiments, bookends (for example, spacers or plates on either side of a server) may be used to stabilize servers that are located next to empty slots or gaps.

In various embodiments shown above, computer systems are repositioned by sliding the computer systems on one or more mounting elements. Nevertheless, in various embodiments, a computer system installed on mounting elements can be moved in other manners. For example, in one embodiment, a computer system may include wheels that allow the computer system to be rolled on a rail. As another example, a computer system may be coupled to a rail by way of a rack-and-pinion arrangement. In certain embodiments, bushings or bearings are provided to facilitate sliding of computer systems on their mounting elements.

In some embodiments, movement of computer systems while installed on mounting elements is non-linear. For example, computer systems may be installed on an arcuate rail. As another example, a system may include set of concentrically stacked, rotating hubs to which various computer systems can be mounted and positioned.

In various embodiments shown above, computer systems are depicted as having enclosures. Nevertheless, in some embodiments, computer systems may be mounted on a rail or shelf without any enclosure for the computer system. In one embodiment, a server with an open chassis and one or more motherboards is installed in a rack such that the server can be moved from one location to another in a rack while the server remains installed in the rack.

Figure 13:
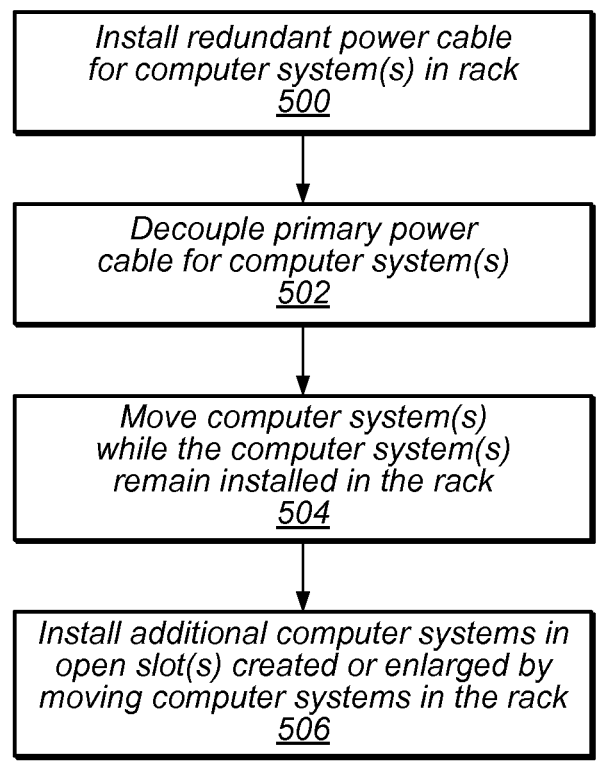
FIG. 13 illustrates an embodiment of managing computing resources in a rack.

FIG. 13 illustrates an embodiment of managing computing resources in a rack. Managing computing resources may include moving computer systems while the computer systems remain in an installed condition and in service (for example, powered-up and with network connections maintained) in a rack. In some embodiments, one or more computer systems are moved to reduce spatial fragmentation in the rack. For example, computer systems that are separated by empty slots may be moved together to eliminate the empty slots.

In some embodiments, managing computing resources includes moving computer systems farther apart while the computer systems remain installed in a rack. In certain embodiments, one or more computer systems are moved to create or enlarge a space between two computer systems. For example, a computer system may be moved to enlarge a 1U slot between two computer systems into a 2U slot.

In some embodiments, computer systems may be initially be installed in all or most of the slots in a rack. Over time, as the system is maintained and some computer systems are taken out of service, space utilization in the rack may become fragmented.

At the time maintenance procedures are initiated, each of the computer systems in a rack may be receiving electrical power from an electrical power source through a primary power cable. The primary power cable may receive power through a rack PDU. To prepare a computer system to be moved to a different location in the rack, a redundant power cable for a computer system may be installed at 500.

In some embodiments, the redundant power cable is plugged into an open receptacle on a rack PDU. Relative to the computer system, the receptacle selected may be in the direction in which the computer system is to be moved. For example, if a computer system near the top of the rack is to be moved to a location near the bottom of the rack, the redundant power cable may be plugged into a rack PDU receptacle midway between the top and the bottom of the rack.

At 502, the primary power cable for the computer system may be decoupled from its electrical power source. Decoupling the primary power cable for the computer system may free up the computer system to advance farther toward the target location. In some embodiments, one or more input/output cables for a computer system may be disconnected prior to moving the computer system.

At 504, the computer system is moved while the computer system remains installed in the rack. Moving the computer system may create or enlarge one or more open slots in the rack. In some embodiments, the computer system is slid along a rail to a new location. In one embodiment, the computer system is moved in a transverse direction in the rack. For example, one of computer systems 104 shown in FIG. 1 may be moved to the left along the rail. By moving one or more computer systems, gaps between computer systems may be eliminated or reduced. Elimination of gaps is shown and described, for example, relative to FIGS. 4A-4C and FIGS. 7A-7B above. In some embodiments, the created or enlarged open slot is larger than the closed-up slot. In some embodiments, the created or enlarged open slot is the same size as the closed-up slot.

Items 500 to 504 may be repeated for any number of computer systems in the system.

At 506, one or more additional computer systems are installed in one or more open slots created or enlarged by moving computer systems in the rack. After moving the computer system, the primary power cables for the computer systems may be reconnected to an electrical power source, and the redundant power cable for the computer system may be disconnected from the electrical power source.

In some embodiments, a redundant power cable is integral to the computer system. In other embodiments, a separate, stand-alone power cable is installed in a spare input power receptacle on the computer system, which can then be removed and reused after the computer system has been moved.

In the embodiment described relative to FIG. 13, moving a computer system involved switching power to a redundant power cable. Nevertheless, in some embodiments, moving computer systems may be performed without redundant power cables or power cable switching for some or all of the computer systems in a rack. For example, the power cables for some or all of the computer systems that are moved may have sufficient slack to allow the computer system to be moved without unplugging the power cables.

For illustrative purposes, many of the systems described herein include computer systems. Nevertheless, in some embodiments, any of various other devices or components may be mounted, positioned, operated, managed, or maintained as described herein. For example, the rack systems described relative to FIGS. 1-4 above can be used to hold medical devices, network equipment, or professional audio amplification systems.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for providing computing resources, comprising:
   one or more vertical mounting bars configured to support one or more computing devices; and
   two or more computing devices coupled to at least one of the one or more vertical mounting bars,
   wherein at least one of the two or more computing devices is coupled to the at least one vertical mounting bar such that the computing device is configurable to slide vertically along at least a portion of the at least one mounting bar from one position to another while the computing device remains in service and installed on the at least one vertical mounting bar, wherein the at least one vertical mounting bar is configured to support the two or more computing devices while at least one computing device supported on the at least one vertical mounting bar is slid vertically along the one or more vertical mounting bars from one position to another.

2. The system of claim 1, wherein the at least one of the computing devices is slidable on at least one of the one or more vertical mounting bars to reduce gaps between computing devices without removing the at least one computing device from the at least one vertical mounting bar.

3. The system of claim 1, the system further comprising one or more rack power distribution units, wherein at least one of the computing devices comprises two or more power cables, wherein a first one of the power cables is configurable to remain plugged into at least one of the rack power distribution units while a second one of the power cables is unplugged and the computing device is moved vertically along at least one of the mounting bars so that the computing device can remain powered up while the computing device is moved along the at least one mounting bar.

4. The system of claim 1, wherein at least one of the computing devices comprises at least one spare power receptacle, the system further comprising:
one or more rack power distribution units;
one or more cables configured to couple between the at least one spare power receptacle and at least one the power distribution units to allow the computing device to remain powered up while the computing device is moved along at least one of the one or more vertical mounting bars.

5. The system of claim 1, further comprising one or more power rails, wherein at least one of the computing devices comprises a power coupling device configured to couple with at least one of the power rails, wherein the at least one power coupling device is configured to remain coupled to the at least one power rail as the computing device is slid vertically from one location to another on the one or more vertical mounting bars.

6. The system of claim 1, further comprising one or more mechanisms configured to move at least one of the computing devices from one position to another on the at least one mounting bar while the at least one computing device remains on the one or more vertical mounting bar.

7. The system of claim 1, further comprising at least one positioning device configured to guide at least one of the computing devices to a predetermined position along at least one of the one or more vertical mounting bars.

8. The system of claim 1, further comprising one or more locking mechanisms configured to lock at least one of the computing devices in position on at least one of the one or more vertical mounting bars.

9. The system of claim 1, wherein at least one of the one or more vertical mounting bars is coupled to a wall.

10. The system of claim 1, further comprising an enclosure configured to house the one or more computing devices.

11. The system of claim 1, wherein the computing devices are positioned in the rack with one or more gaps between at least two of the computing devices, the system further comprising at least one air moving device configured to move air through at least one of the gaps between the computing devices.

12. A system for providing computing resources, comprising:
one or more vertical mounting elements configured to support one or more computing devices; and
two or more computing devices coupled to at least one of the vertical mounting elements,
wherein at least one of the two or more computing devices is coupled to the at least one vertical mounting elements such that the computing device is configurable to move from one position to another while the computing device remains in service and installed on the at least one vertical mounting element, wherein the at least one vertical mounting element is configured to support the two or more computing devices while at least one computing device supported on the at least one mounting element is slid vertically along the at least one vertical mounting element from one position to another.

13. The system of claim 12, wherein at least one of the one or more vertical mounting elements comprises a mounting bar, wherein at least one of the two or more computing devices is configured to slide vertically on the at least one vertical mounting bar to move the at least one computing device vertically from one position to another.

14. The system of claim 12, wherein the at least one of the two or more computing devices is vertically movable to reduce gaps between computing devices without removing the at least one computing device from the at least one vertical mounting element.

15. A method of managing computing resources in a rack, comprising:
sliding at least one computing device vertically along one or more vertical mounting bars while the at least one computing device remains in service, installed in the rack, while the at least one computing device and at least one additional computing device are supported by the one or more vertical mounting bars, to create or enlarge one or more open slots in the rack; and
installing at least one additional computing device in at least one of the one or more open slots.

16. The method of claim 15, wherein moving computing devices comprises reducing at least one gap between computing devices in the rack.

17. The method of claim 15, wherein moving computing devices comprises closing up at least one empty slot between computing devices in the rack.

18. The method of claim 17, wherein at least one of the one or more created or enlarged open slots is larger than the closed-up empty slot.

19. The method of claim 15, further comprising moving air through at least one opening between computer systems created or enlarged by moving the at least one computer system.

20. The method of claim 19, wherein moving the at least one computer system while the computer system remains installed in the rack comprises:
coupling a redundant power cable for the computer system with an electrical power source; and
before moving the at least one computer system, decoupling a primary power cable for the computer system from an electrical power source.

* * * * *